Figure 1:
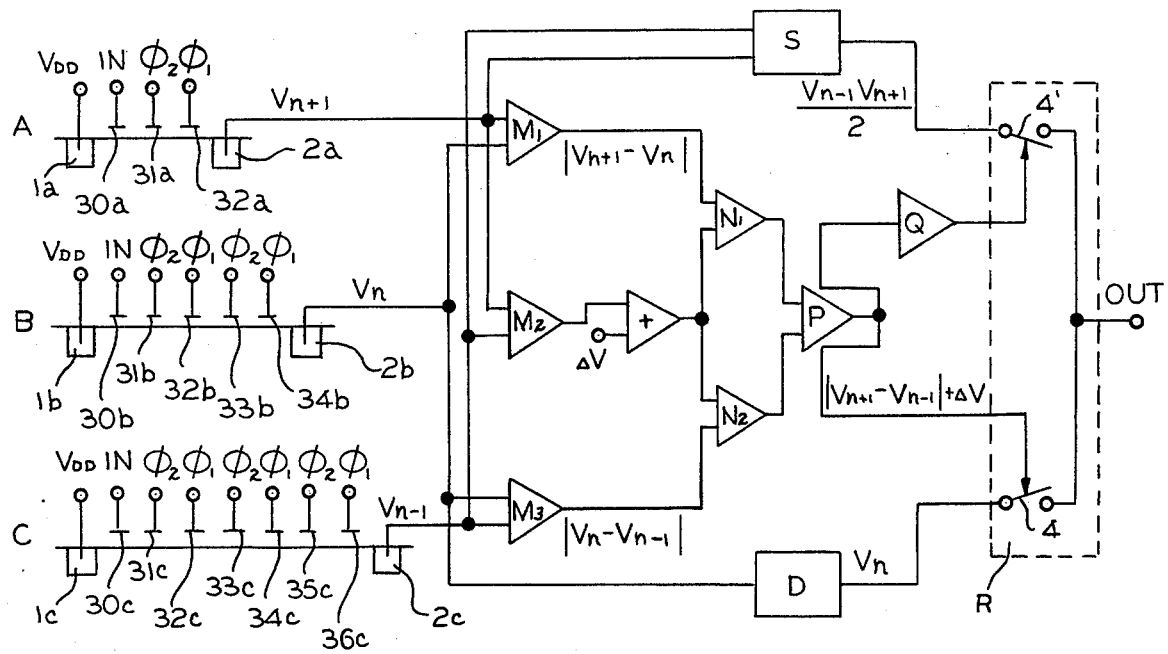

United States Patent [19]
Tanahashi

[11] 4,353,001
[45] Oct. 5, 1982

[54] NOISE SIGNAL SUPPRESSOR HAVING IMPROVED OUTPUT SIGNALS

[75] Inventor: Kyoji Tanahashi, Tokyo, Japan

[73] Assignee: Nippon Electric Co., Ltd., Tokyo, Japan

[21] Appl. No.: 194,803

[22] Filed: Oct. 7, 1980

[30] Foreign Application Priority Data

Oct. 8, 1979 [JP] Japan ................... 54-129713

[51] Int. Cl.³ ........................................... H03K 17/16
[52] U.S. Cl. .................................... 307/542; 307/544; 307/352; 328/165; 328/151
[58] Field of Search ............... 328/151, 165; 307/352, 307/542, 549, 550

[56] References Cited

U.S. PATENT DOCUMENTS

| | | | |
|---|---|---|---|
| 3,641,444 | 2/1972 | Watts | 328/165 |
| 4,085,340 | 4/1978 | Salesky et al. | 307/549 |
| 4,121,183 | 10/1978 | Murphy | 307/542 |
| 4,282,515 | 8/1981 | Patterson | 307/352 |
| 4,291,405 | 9/1981 | Jayant et al. | 328/165 |

Primary Examiner—John S. Heyman
Attorney, Agent, or Firm—Laff, Whitesel, Conte & Saret

[57] ABSTRACT

A noise suppressor receives successive signal values which are obtained by sampling an input signal at a predetermined frequency. A first signal voltage is $V_{n-1}$, a second signal voltage is $V_n$ and a third signal voltage is $V_{n+1}$. These three voltages are compared, where the relationships are:

$$V_n - V_{n-1} \geq V_{n-1} - V_{n+1} + \Delta V \ldots \quad (1)$$

$$V_n - V_{n+1} \geq V_{n-1} - V_{n+1} + \Delta V \ldots \quad (2)$$

If these relationships are simultaneously satisfied, a signal output is equal to $(V_{n-1}+V_{n+1})/2$. In the other cases, the second signal value is the output. Since three successive signals are compared and if the middle signal value involves a substantial noise component, an average value of the signals on both sides is derived as an output signal, which is closer to an inherent signal.

13 Claims, 12 Drawing Figures

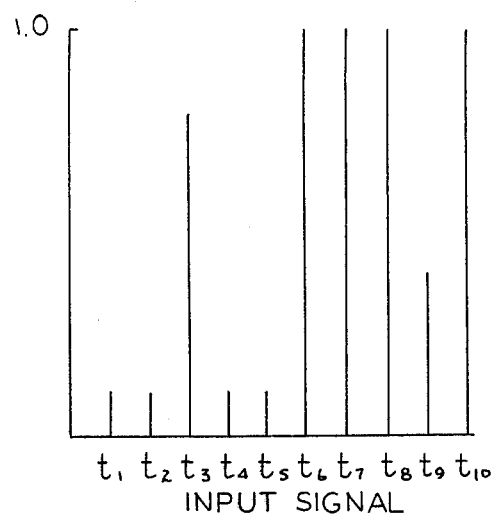
FIG.2(a) INPUT SIGNAL
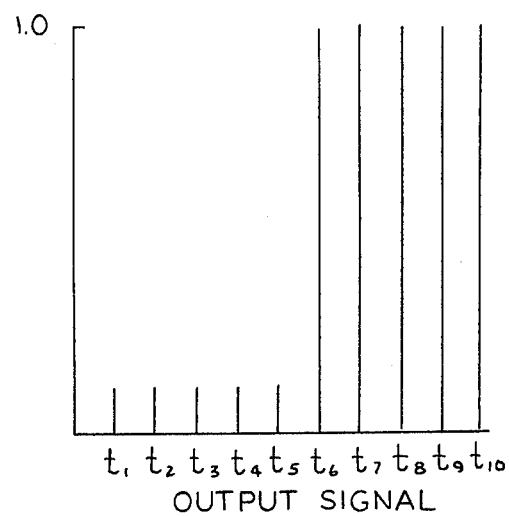
FIG.2(a') OUTPUT SIGNAL
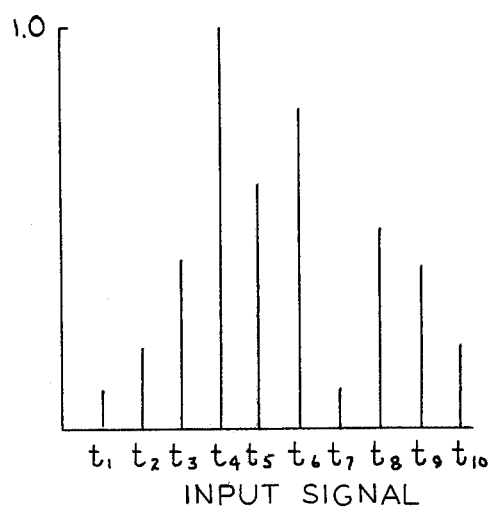
FIG.2(b) INPUT SIGNAL
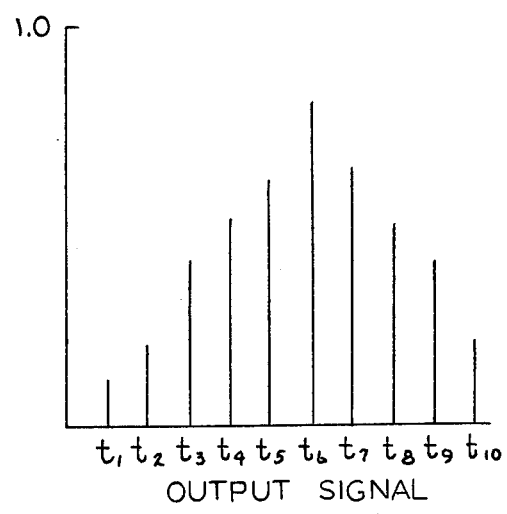
FIG.2(b') OUTPUT SIGNAL
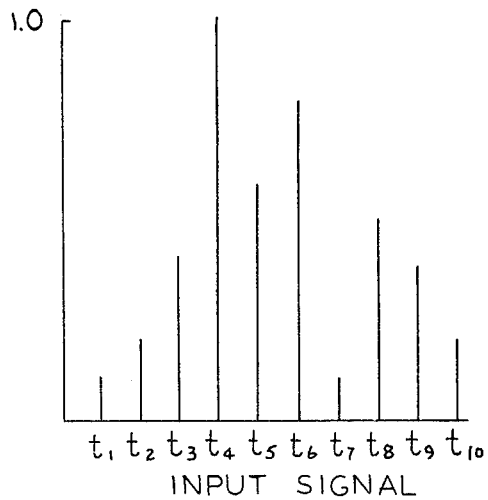
FIG.2(c) INPUT SIGNAL
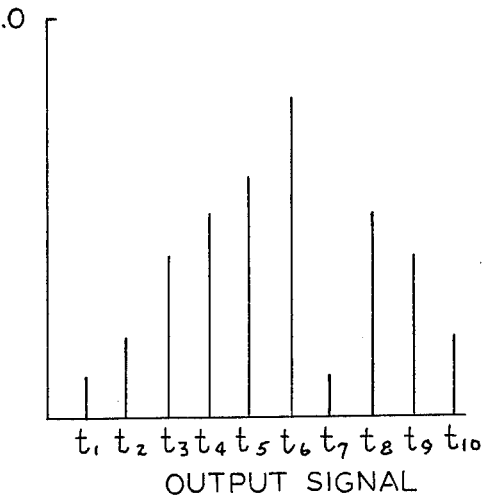
FIG.2(c') OUTPUT SIGNAL

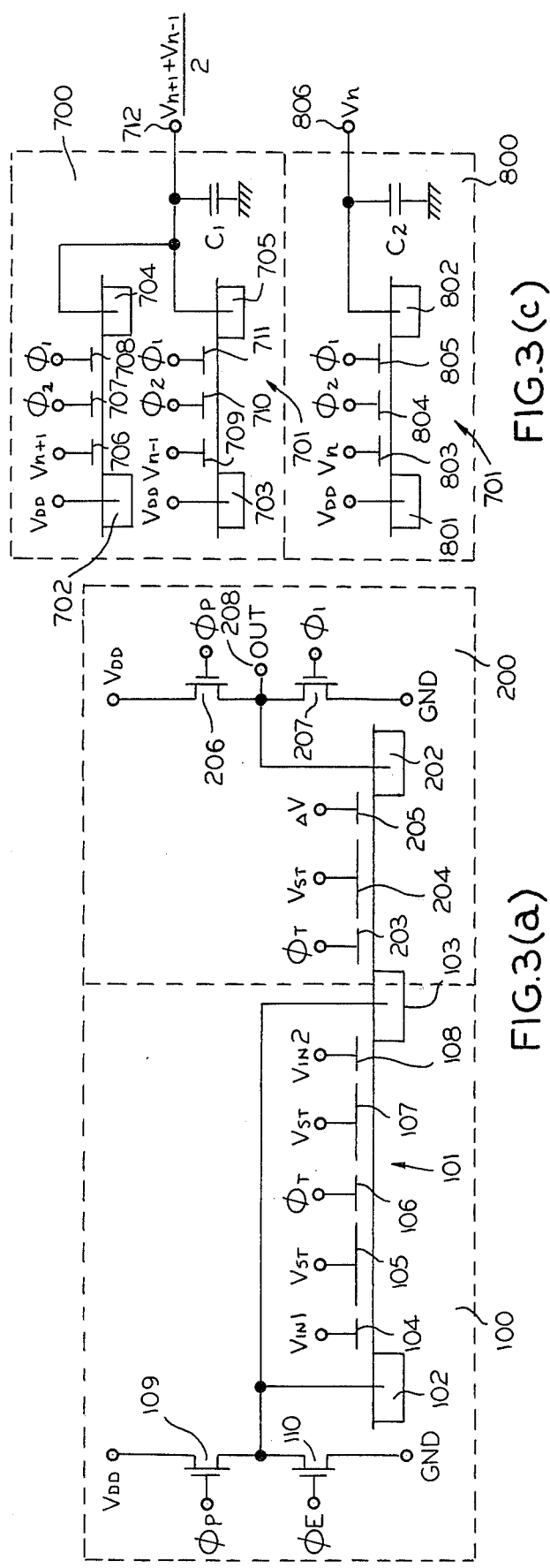
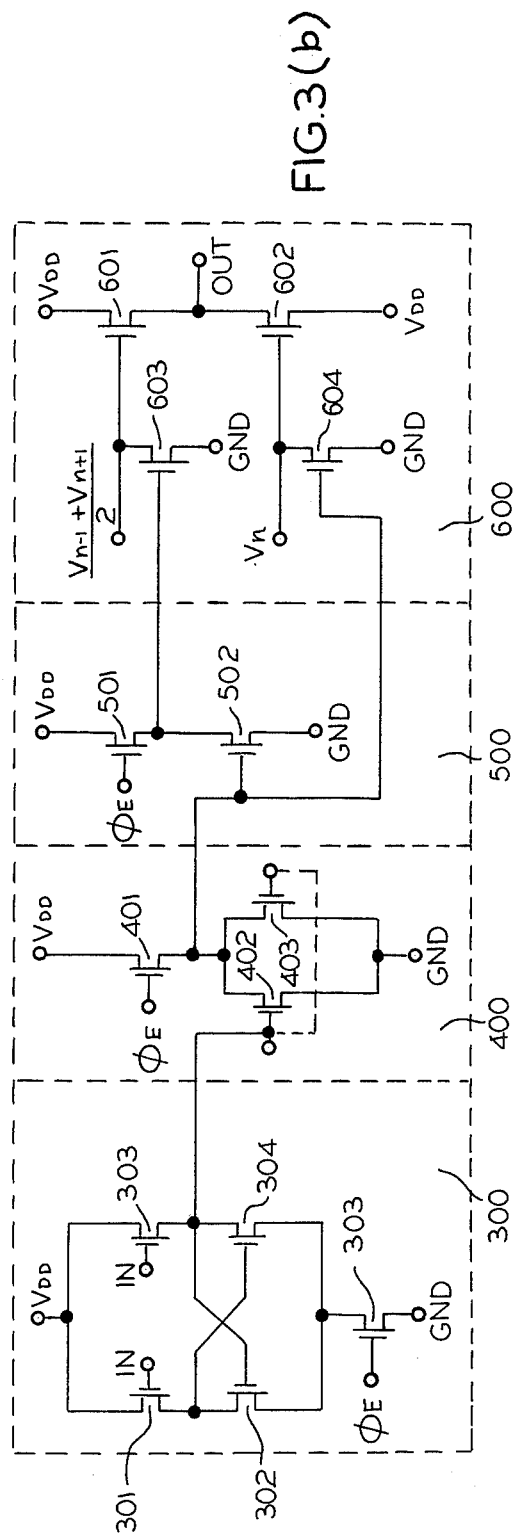
FIG.3(a)
FIG.3(b)
FIG.3(c)

NOISE SIGNAL SUPPRESSOR HAVING IMPROVED OUTPUT SIGNALS

The present invention relates to a noise suppressor for suppressing or eliminating noise in an input signal.

Circuits for processing analog signals include such things as an image sensor for detecting analog quantities as image information items. These circuits have a number of distinct features which are different from those of devices for processing digital quantities (especially, memory devices). The most important point is that it is possible to define predetermined relationships between successive points in a continuous signal. In other words, at any arbitrary point in a series of continuous signal, the signal would scarcely take a singular signal value that is largely different from the analog quantities just before and just after the signal point. This is, it is possible to predict that an analog quantity of a given signal at a given time point should be within a predetermined scope or range with respect to the immediately preceding and succeeding values of the signal. Accordingly, by detecting a difference between the analog values of the input signal at two succeeding time points and by comparing the difference within the above predetermined scope, it is possible to distinguish a signal from a noise and thus to suppress the noise in the input signal.

Such noise suppressor circuits for an analog signal have been disclosed in U.S. Pat. Nos. 3,689,845 and 3,739,285. In every one of these known noise suppressors, a steep pulse-shaped noise in an audio signal is picked up by a differentiation circuit to intercept transmission of the audio signal to the next stage during the period when the pulse-shaped noise is present. During this interception period the immediately preceding audio signal voltage is fed to the next stage. Accordingly, these known circuits had a disadvantage in that the circuit construction was complexed, and also the continuity of the signal between the interception period and the preceding or succeeding period was poor, thereby causing a distortion of the output signals.

It is, therefore, a major object of the present invention to provide an improved noise suppressor in which a noise in an input signal can be suppressed and in which a signal close to an inherent signal component is derived from the noise suppressor.

According to the present invention, a noise suppressor sample the successive signal values by sampling an input signal at a predetermined frequency. A comparison is made between a first signal value of $V_{n-1}$ voltage, a second signal value of $V_n$ voltage and a third signal value of $V_{n+1}$ voltage. These signals are compared in such manner that if the relationships:

$$|V_n - V_{n-1}| \geq |V_{n-1} - V_{n+1}| + \Delta V \quad (1)$$

$$|V_n - V_{n+1}| \geq |V_{n-1} - V_{n+1}| + \Delta V \quad (2)$$

are simultaneously satisfied, a signal equal to $(V_{n-1} + V_{n+1})/2$ is the output. If at least one of these relationships are not satisfied, the second signal value is output.

According to the noise suppressor of the present invention, three successive signal values are compared. If the middle signal value involves a substantial noise component, an average value of the signal values on both sides is derived as an output signal. The derived output signal is closer to an inherent signal. Moreover, the detection of whether or not the input signal involves a substantial noise component is effected by comparing three successive signal values; thus, even if an abrupt voltage change should arise in the inherent signal itself, it would not be detected as a noise.

In this respect, in the above-described prior art technique, noise detection was effected by a differentiation circuit. If the inherent signal involves an abrupt change in voltage, it was detected as a noise. Furthermore, the noise suppressor in the prior art was not suitable for a semiconductor integrated circuit because it necessitated a differentiation circuit and capacitors for holding signal voltages.

According to the present invention, the noise suppressor is suitable for a semiconductor integrated circuit because it can be simply constructed from only comparators, adders and subtractors, which are types of circuits which can be easily constructed on a single semiconductor chip.

Figure 4A:
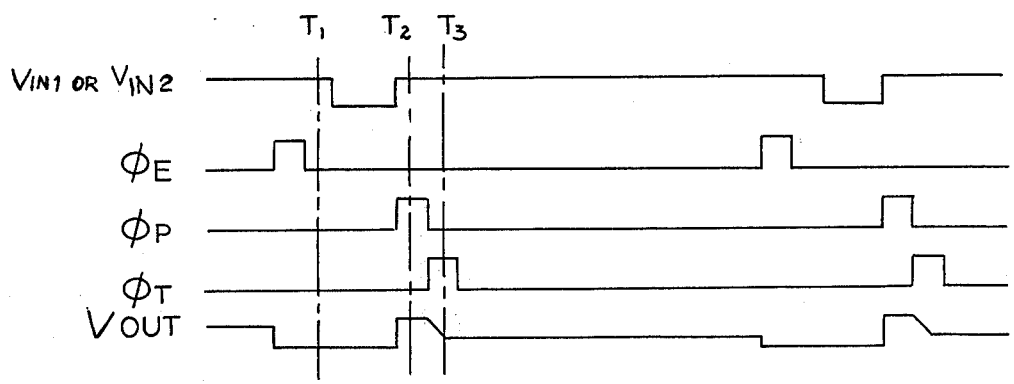
Figure 4B:
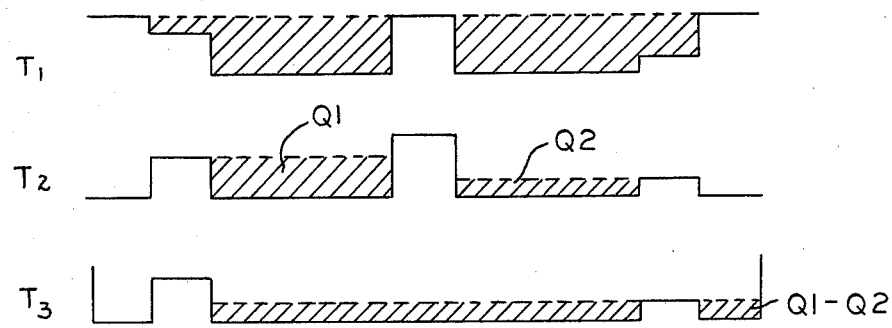

The above and further objects, features and advantages of the present invention will become more apparent from the following detailed description of embodiment taken in conjunction with the accompanying drawings, wherein:

FIG. 1 is a block diagram showing a noise suppressor according to one preferred embodiment of the present invention;

FIGS. 2(a), 2(b) and 2(c) are waveform diagrams showing three examples of input signal waveforms applied to the noise suppressor according to the present invention and FIGS. 2(a'), 2(b') and 2(c') are waveforms showing three examples of output signals derived in response to the inputs shown in FIGS. 2(a), 2(b) and 2(c);

FIGS. 3(a), 3(b) and 3(c) are circuit diagrams showing the details of the respective blocks in the noise suppressor shown in FIG. 1;

FIG. 4(a) is a timing chart showing the signals applied to the subtractor shown in FIG. 3(a); and FIG. 4(b) is a potential distribution diagram showing surface potentials under the respective gates in the subtractor shown in FIG. 3(a) at three successive time points $T_1$, $T_2$ and $T_3$, as marked in FIG. 4(a).

In FIG. 1, one preferred embodiment of the present invention is illustrated. Here, voltages of an input signal V (taken at a series of successive times $t_1, t_2, \ldots, t_{n-1}, t_n, t_{n+1}, \ldots$) are represented by $V_1, V_2, \ldots, V_{n-1}, V_n, V_{n+1}, \ldots$.

On the input side, there are three delay channels A, B and C, each consisting of a charge-coupled device. Each of the channels A, B or C is formed on a semiconductor substrate of one conductivity type and comprises a charge source $1_a$, $1_b$. The channel $1_c$ of the other conductivity type to which a constant voltage $V_{DD}$ is applied, and a charge-voltage converter region ($2_a$, $2_b$ and $2_c$) of the other conductivity type from which a sampled and delayed signal ($V_{n+1}$, $V_n$ and $V_{n-1}$) is derived. A stripe of the other conductivity type region may be employed as the charge sources $1_a$, $1_b$ and $1_c$ instead of separate three regions.

Between each couple of a charge source and a charge-voltage converter region, are serially formed an input electrode ($30_a$, $30_b$ and $30_c$) and plurality of transfer electrodes ($31_a \sim 32_a$, $31_b \sim 34_b$ and $31_c \sim 36_c$) isolated from the semiconductor substrate by a thin film of insulator (not shown). The input electrodes $30_a$, $30_b$ and $30_c$ are adjacent to the charge sources $1_a$, $1_b$ and $1_c$, respectively. An input signal IN is applied via electrodes $30_a$, $30_b$ and $30_c$.

Clock pulses $\phi_1$ and $\phi_2$ have different phases. Each of the clock pulses $\phi_1$ and $\phi_2$ is applied to every other transfer electrodes to transfer charges to charge-voltage converter region ($2_a$, $2_b$ and $2_c$). Among these clock pulses, the clock pulse $\phi_2$ is also used for sampling the input signal IN. The numbers of the transfer electrodes in the respective channels A, B and C are respectively selected in such manner that at time $t_{n+2}$ a signal of voltage $V_{n+1}$ may be output from the charge-voltage converter region $2_a$ of the channel A. At the same time, a signal of voltage $V_n$ may be output from the charge-voltage converter region $2_b$ of the channel B, and a signal of Voltage $V_{n-1}$ may be output from the charge-voltage converter region $2_c$ of the channel C.

The outputs of the channels A and B are applied to a subtractor $M_1$ to derive an output equal to $|V_{n+1} - V_n|$. The outputs of the channels A and C are applied to a subtractor $M_2$ to derive an output equal to $|V_{n+a} - V_{n-1}|$. The outputs of the channels B and C are applied to a subtractor $M_3$ to derive an output equal to $|V_n - V_{n-1}|$. The output of the subtractor $M_2$ is added to a preset fixed voltage $\Delta V$ by an adder "+" to derive an output equal to $|V_{n+1} - V_{n-1}| + \Delta V$. The output of the adder "+" and the output of the subtractor $M_1$ are compared with each other in a comparator $N_1$. The comparator $N_1$ delivers an output to an AND circuit P when the above-described relationship (2) is fulfilled. On the other hand, the output of the adder "+" and the output of the subtractor $M_3$ are compared with each other in a comparator $N_2$. The comparator $N_2$ delivers an output to the AND circut P when the above-described relationship (1) is fulfilled.

Consequently, when at least one of the relationships (1) and (2) is not simultaneously fulfilled, the output of the AND circuit P turns on the switch 4 in the switching circuit R to enable an occurrence of the voltage $V_n$ at the output terminal OUT. Both the relationships (1) and (2) are simultaneously fulfilled, the output of the AND circuit P turns off the switch 4. However, the output is inverted by the inverter Q to turn on the switch 4'. As a result the voltage $(V_{n-1} + V_{n+1})/2$ appears at the output terminal OUT. The voltage $(V_{n-1} + V_{n+1})/2$ applied to the switch 4' is synthesized from the outputs of the delay channels A and C, by a synthesizer S. The synthesizer S gives a time delay to synchronize with operation of the switching circuit R. The voltage $V_n$ is derived from the delay channel B and is applied to the switch 4 by way of a delay circuit D, thus giving a time delay equal to that which occurs in the synthesizer S.

Waveform pairs representing the relationships between the input and output signals of the above-described noise suppressor, according to the present invention, are shown at (a)-(a'), (b)-(b') and (c)-(c') in FIG. 2. In the waveform diagrams, time is taken along the abscissa and a voltage is taken along the ordinate, as normalized by selecting the maximum voltage at the reference value 1.0. The waveform pair shown in FIG. 2 at (a)-(a') is an example for a digital input signal in which the fixed voltage $\Delta V$ is set at zero. The waveform pair shown in FIG. 2 at (b)-(b') is an example for an analog input signal in which the fixed voltage $\Delta V$ is set at 10% of the reference voltage 1.0. The waveform pair shown at (c)-(c') is another example for the same analog input signal in which the fixed voltage $\Delta V$ is set at 20% of the reference voltage 1.0. The waveforms shown at (a), (b) and (c) represent input signals to the noise suppressor. The waveforms shown at (a'), (b') and (c') represent the corresponding output signals issued from the noise suppressor.

In the case where a digital signal is input to the noise suppressor, as shown at (a)-(a') in FIG. 2, it is desirable to select the arbitrary fixed voltage $\Delta V$ at 0 V. Among a series of input signal values $V_1$ to $V_{10}$, the signal values at time $t_3$ and $t_9$ do not satisfy both the aforementioned relations (1) and (2) and thus they are deemed to be erroneous signal values. So, an average value of the voltages at time $t_2$ and $t_4$ and an average value of the voltages at time $t_8$ and $t_{10}$ are, respectively, supplied as output signals in place of the erroneous signal values, thus resulting in a reshaped signal as shown at (a'). In the case where a digital signal is input to the noise supressor, it is necessary to set the clock and sampling signals at a frequency by which a pulse of the input signal can be sampled at least two times.

Next, with respect an analog signal input to the noise suppressor, a description will be made on how the reshaped signal is modified by varying the arbitrary fixed voltage $\Delta V$. By way of example, reference is made to the waveforms shown at (b)-(b') and (c)-(c') in FIG. 2. When the arbitrary fixed voltage $\Delta V$ is set at 10% of the reference voltage 1.0, then the input signal values at times $t_4$ and $t_7$ are deemed to be erroneous signal values as shown at (b)-(b') in FIG. 2. Whereas, when the arbitrary fixed voltage $\Delta V$ is set at 20% of the reference voltage 1.0, then only the input signal value at time $t_4$ is deemed to be an erroneous signal value as shown at (c)-(c') in FIG. 2.

As described above, to derive a smooth signal having a small change as an output signal, it is necessary to select the arbitrary fixed voltage $\Delta V$ at a small value. Normally, it is favorable to select the arbitrary fixed voltage $\Delta V$ at 0.1 to 0.2 times as small as the maximum voltage of the input signal, to be handled. As a matter of course, if the maximum voltage of the input signal is employed as the arbitrary fixed voltage $\Delta V$, then the input signal, per se, is derived at the output. In these cases, the clock and sampling frequency may be selected to be between 100 KHz and 10 MHz for an image signal and between 40 KHz and 100 KHz for an audio signal.

One example of the subtractors $M_1$, $M_2$ and $M_3$, the adder "+", the comparator N, the AND circuit P, the inverter Q, the switching circuit R, the synthesizer S, and the delay circuit D to be employed in the noise suppressor circuit shown in FIG. 1 are illustrated in FIGS. 3(a), 3(b) and 3(c) as blocks 100, 200, 300, 400, 500, 600, 700 and 800, respectively.

The subtractor 100 is constructed on a semiconductor substrate 101 of one conductivity type. Two regions 102 and 103 are the other conductivity type and operate as both the charge sources and the charge-voltage converter regions. The function of these regions 102 and 103 is controlled by the circuit of the MOS FETs 109 and 110 connected in series between the ground terminal GND and the power source terminal $V_{DD}$. The MOS FETs 109 and 110 are made conductive by the clock signals $\phi_P$ and $\phi_E$ applied to the gates of the MOS FETs 109 and 110, respectively. On the semiconductor substrate 101 between the regions 102, 103, gate electrodes 104, 105, 106, 107 and 108 are disposed so that they may be isolated from the substrate 101 by a thin insulator film (not shown). The gate electrodes 104 and 108 receive an output signal from the delay channel A, B and C as input signals V$_{in1}$ and V$_{in2}$, respectively. The gate electrodes 105 and 107 receive the same constant voltage V$_{ST}$. The gate electrode 106 receives a transfer pulse $\phi_T$ to enable a transfer of the charges under the gate electrodes 105 and 107, thereby achieving a substraction between input signals V$_{in1}$ and V$_{in2}$.

Next, we will explain the subtraction operation of the subtractor 100 in more detail taken in conjunction with the drawings in FIGS. 4(a) and 4(b). FIG. 4(a) shows a timing chart for an input signal Vin. The clock pulses $\phi_E$, $\phi_P$ and $\phi_T$ are applied to the respective clock terminals having the same designations in other figures. The input signal V$_{in1}$ or V$_{in2}$ and output signal V$_{out}$ are also shown in FIG. 4(a) FIG. 4(b) shows a surface potential distribution under the respective gates at times points T$_1$, T$_2$ and T$_3$, as marked in FIG. 4(a). It is noted that the output signal V$_{out}$ is a signal corresponding to the charges derived from the region 103 and fed into the adder 200.

In operation, initially when the clock signal $\phi_E$ is applied, the potential at the regions 102 and 103 takes a low level. Hence, charges are respectively stored through input electrodes V$_{in1}$ and V$_{in2}$ under the gate electrodes 105 and 107, which are maintained at a constant high level V$_{st}$ (time point T$_1$ in FIG. 4(b)). Subsequently, when the regions 102 and 103 are raised to the high level by applying the clock pulse $\phi_P$, the charges are drawn out under the gate electrodes 104 and 108. Then, charges Q$_1$ and Q$_2$ left at time T$_2$ (FIG. 4(b)) correspond to the potential differences between the surface potential under the gate electrodes 105 and 107, to which the constant voltage V$_{st}$ is applied, and the respective surface potentials under the input gate electrodes 104 and 108.

Thereafter, the transfer pulse $\phi_T$, raises the surface potential under the transfer gate electrode 106, which separates the stored charges under the two gate electrodes 105 and 107, and the regions under the two gate electrodes 105 and 107 are brought into an electrically continuing condition. Then, due to the charges Q$_1$ and Q$_2$ respectively stored under the two gate electrodes 105 and 107, a difference between the two charges (Q$_1$-Q$_2$) is newly derived at the output terminal (T$_3$ in FIG. 4(b)). Strictly speaking, the derived signal (Q$_1$-Q$_2$) has a smaller value in response to the charges newly stored under the transfer gate electrode 106, but the difference can be made negligible if the area under the transfer gate is a sufficiently small value, as compared to the area under the gate electrodes 105 and 107. Then, if the two regions 102 and 103 are jointly connected, an absolute value |Q$_1$-Q$_2$| of the difference of the electric charges Q$_1$ and Q$_2$ can be obtained as shown by block 100 in FIG. 3(a).

While description has been made above in connection to one preferred embodiment of a subtractor 100 for deriving a difference between two signals, the subtractor is not limited to the illustrated embodiment. Any subtractor means could be employed as long as, after charges are corresponding to the different signals have been respectively stored, a difference between the two stored charges can be derived. Or else, the subtractor can be replaced by a semiconductor circuit employing bipolar transistors or field effect transistors, such as a differential amplifier or the like.

In order to add an arbitrary fixed voltage ΔV to the difference between two signals derived by the subtractor 100, a charge-coupled device can be used, as shown by block 200 in FIG. 3(a). Such an adder 200 can be realized in a similar manner, on the basis of the method for deriving a difference between two signals, as described previously.

The adder 200 is formed on the semiconductor substrate 101 together with the subtractor 100. Input charges are introduced from the region 103 in response to the application of the transfer pulse $\phi_T$ to the gate electrode 203, which electrode is separated from the substrate 101 by a thin insulator film (not shown). The introduced charges, which are stored under the gate electrode 204, are kept at a constant voltage V$_{st}$ and are isolated from the substrate 101 by a thin insulator film (not shown). Prior to the introduction of charges, the preset fixed voltage ΔV is applied to the gate electrode 205 to store the charges corresponding to the fixed voltage ΔV. This charge introduction is performed by applying the clock pulse $\phi_E$ to the gate of the MOS FET 207 for introducing charges and to the gate electrode 204, and by applying the clock pluse $\phi_E$ to the gate of the MOS FET 206 for releasing charges. The interconnecting point of MOS FETs 206 and 207 also functions as output terminal 208 when none of the clock pulses $\phi_P$ and $\phi_E$ is applied.

The circuit portion including the comparator 300 and the subsequent AND circuit 400 for determining whether or not a signal value observed at time t$_n$ is a correct input signal, is illustrated in FIG. 3(b). The comparator 300 is composed of five MOS FETs 301 to 305. The source and drain paths of MOS FETs 301 and 302 are connected in series and are connected in parallel with a series connection of MOS FETs 303 and 304. To the gates of the MOS FETs 301 and 303, the outputs from the subtractor M$_1$ or M$_3$ and the adder "+" are applied, respectively. The gate of the MOS FET 304 is connected to the drain of the MOS FET 302, and the gate of the MOS FET 305 is connected to the drain of the MOS FET 304. The MOS FET 305 is connected between the sources of the MOS FETs 302 and 304 and the ground terminal GND. The MOS FET 305 controls the subtracting operation of the circuit of the MOS FETs 301 to 304, in response to the clock pulse $\phi_E$. The output is derived from the connection between MOS FETs 303 and 304 and applied to the next AND circuit 400.

Two comparators such as the comparator 300 are provided and their repective outputs are applied respectively, to the gates of two MOS FETs 402 and 403 which are interconnected in an AND circuit 400. However, for the purpose of facilitating an understanding of the circuit construction, only one comparator is shown in FIG. 3(b). The AND circuit 400 has a load MOS FET 401 and two parallel connected MOS FETs 402 and 403. The clock pulse $\phi_E$ is applied to the gate of the MOS FET 401 for controlling the AND operation. An output is derived from the interconnecton point between the MOS FETs 401, 402 and 403.

The output of the AND circuit 400 is connected, on one hand, directly to the switching circuit R shown by block 600, and on the other hand, via the inverter Q shown by block 500 to the same switching circuit 600. The inverter 500 is a conventional inverter, in which two MOS FETs 501 and 502 are connected in series. An input signal is applied to the gate of the MOS FET 502, while clock pulses $\phi_E$ are applied to the gate of the MOS FET 501.

The switching circuit 600 is an output circuit which reshapes signals. It constructed to derive an output from an intermediate junction point between two serially connected MOS FETs 601 and 602. To the respective gates of these two MOS FET's 601 and 602 are respectively connected the drains of two MOS FET's 603 and 604. The sources of MOS FET's 603, 604 are both grounded and their gates receive the input signal and the output signal, respectively, of the inverter 500. The voltages $(V_{n-1}+V_{n+1})/2$ and $V_n$, respectively, are also applied to the gates of MOS FET's 601, 602. Only when an output from the AND circuit 400 is (that is, only when a high level output is issued from the AND circuit 400), the MOS FET 602 receiving the signal $V_n$ at time $t_n$ is inactivated and the other MOS FET 601 receiving the signal $(V_{n+1}+V_{n-1})/2$ is activated.

The voltage $(V_{n-1}+V_{n+a})/2$ is synthesized by the synthesizerS, shown by block 700 in FIG. 3(c). The synthesizer 700 is of a charge transfer type of device and is formed on a semiconductor substrate 701 of one conductivity type. The regions 702 and 703 are of the other conductivity type and are held at the power supply voltage $V_{DD}$. While these regions 702 and 703 are here shown as being separate, a single long-shape region can be replace these separate regions 702 and 703. The regions 704 and 705 are of the other conductivity type and operate as charge-voltage converting regions. These regions 704 and 705 may be also replaced by a single long-shaped region.

Between these regions 702 and 704, a gate electrode 706 receives the input voltage $V_{n+1}$ which is derived from the channel A, a gate electrode 707 receives a clock pulse $\phi_2$, and a gate electrode 708 receives a clock pulse $\phi_1$. These gate electrodes 706, 707 and 708 are isolated from the semiconductor substrate 701 by a thin insulator film (not shown). Similarly, between regions 703 and 705, a gate electrode 709 receives the voltage $V_{n-1}$ from the channel C, a gate electrode 710 receives a clock pulse $\phi_2$, and a gate electrode 711 receives a clock pulse $\phi_1$. These electrodes are also isolated from the substrate 701 by a thin insulator film (not shown). The voltages obtained at the regions 704 and 705 are commonly applied to the capacitor $C_1$ and to the gate of the MOS FET 601 via an output terminal 712. The clock pulses $\phi_1$ and $\phi_2$ are applied to terminals 707, 708 to synchronize the application of the voltage $(V_{n-1}+V_{n+1})/2$ to the gate of the MOS FET 601 with the application of the inverted signal from the inverter 500 to the gate of the MOS FET 603.

The voltage $V_n$ is obtained from the channel B and is applied to the gate of the MOS FET 602 via the delay circuit D shown by the block 800 in FIG. 3(c). The delay circuit D gives the same time delay as that of the synthesizer 700. The regions 801 and 802 of the other conductivity type is formed on the same semiconductor substrate 701. Between these regions 801 and 802, a gate electrode 803 receives a voltage $V_n$ from the channel B, a gate electrode 804 receives the clock pulses $\phi_2$, and a gate electrode 805 receives the clock pulse $\phi_1$. These electrodes are isolated from the semiconductor substrate 701 by a thin insulator film (not shown). The output voltage obtained from the region 802 is applied to the capacitor $C_2$, having a capacitance equal to a half of that of the capacitor $C_1$, and is applied to the gate of the MOS FET 602 via the output terminal 806.

According to the above embodiment, small capacitances are required at the capacitors $C_1$ and $C_2$. Therefore, all the parts can be integrated on a single semiconductor chip use of an by MOS technique. The resultant output is very similar to the inherent signal. For input digital signals the output signal changes sharply and is not deformed by noise. Especially sharp changes in input signal are not detected as noise. For analog signals, the output keeps its continuity, and results is very small deformation caused by noise.

While the present invention has been described above in connection to one preferred embodiment thereof, it is intended that the means for embodying the present invention should not be limited to those employed in the above-described preferred embodiment.

What is claimed is:

1. A noise suppressor for suppressing noise components contained in an input signal V, said suppressor comprising means for obtaining a value $V_{n-1}$ of said signal V at time $t_{n-1}$, a value $V_n$ of said signal V at time $t_n$, and a value $V_{n+1}$ of said signal V at time $t_{n+1}$, means for receiving a predetermined signal increment V, means for producing quantities $|V_n-V_{n-1}|$, $|V_n-V_{n+1}|$, and $|V_{n-1}-V_{n+1}|+\Delta V$ from said values $V_{n-1}$, $V_n$, $V_{n+1}$, and $\Delta V$, means for generating a control signal when said quantities simultaneously satisfy the relations of $|V_n-V_{n-1}| \geq |V_{n-1}-V_{n+1}|+\Delta V$ and $|V_n-V_{n+1}| \geq |V_{n-1}-V_{n+1}|+\Delta V$, and signal synthesizer means for deriving a quantity $(V_{n-1}+V_{n+1})/2$ when said control signal is present and outputing sid signal value $V_n$ when said control signal is absent.

2. A noise suppressor comprising a signal input terminal, first delay circuit means for delaying an input signal received at said signal input terminal by a first period, second delay circuit means for delaying the input signals received at said signal input terminal by a second period, third delay circuit means for delaying the input signals received at said signal input terminal by a third period, first signal synthesizer circuit means for forming an absolute value of a difference between the outputs of said first and second delay circuits, second signal synthesizer circuit means for forming an absolute value of a difference between the outputs of said first and third delay circuit means added to a predetermined voltage, third signal synthesizer circuit means for deriving an absolute value of a difference between the outputs of said second and third delay circuit means, first comparator circuit means for comparing the outputs of said first and second signal synthesizer circuit means with each other to derive a first intermediate output when the output of said first signal synthesizer circuit means is equal to or large than the output of said second signal synthesizer circuit means, second comparator circuit means for comparing the outputs of said second and third signal synthesizer circuit means with each other to derive a second intermediate output when the output of said third signal synthesizer circuit means is equal to or larger than the output of said second signal synthesizer circuit means, an AND circuit means for giving a third intermediate output when both said first and second intermediate outputs are present, fourth signal synthesizer circuit means for deriving a value equal to one half of a sum of the outputs of said first and third delay circuit means, and an output switching circuit means from an output terminal during the time period when said third intermediate output is derived from said AND circuit means and for deriving the output of said second delay circuit means from the output terminal during the remaining time period.

3. A noise suppressor as claimed in claim 2, in which the difference between said first period and said second period is equal to the difference between said second period and said third period.

4. A noise suppressor as claimed in claim 3, in which said first, second and third delay circuit means are respectively formed of charge-coupled devices.

5. A noise suppressor as claimed in claim 2, 3 or 4, in which said predetermined voltage is equal to zero.

6. A noise suppressor as claimed in claim 2, 3 or 4, which said predetermined voltage is equal to 1/10~2/10 of the maximum voltage of said input signal received at said signal input terminal.

7. A noise suppressor as claimed in claim 2, 3 or 4, in which said predetermined voltage is equal to or smaller than 2/10 of the maximum voltage of said input signal received at said signal input terminal.

8. A signal noise suppressor comprising means for repeatedly comparing samples of signals in each of three successive sample periods, means for detecting conditions wherein any sample is an illogical deviation from its preceding and succeeding samples, and means for substituting an average of said preceding and succeeding samples for said illogical sample.

9. The suppressor of claim 8 wherein said noise suppressor is an integrated semiconductor circuit.

10. A noise suppressor comprising three input channel means for cyclically passing input signals in each of three successive time periods, means for comparing the signal in the middle time period with signals in its adjacent time periods, and means responsive to said comparing means for substituting an average of the signals in adjacent time periods for said middle signal when the compared difference exceeds a predetermined amount.

11. The suppressor of claim 10 wherein each of said input channels comprises a charge coupled delay line driven by phased clock pulses to produce delays of one, two, and three basic periods, respectively.

12. The suppressor of claim 11 and means for subtracting the output of each channel from the output of its next adjacent neighboring channel whereby the subtracted difference is a comparison of adjacent signals.

13. The suppressor of claim 12 and means responsive to the sum of said subtracted signals for feeding back a correction signal to produce an average signal when said sum indicates that a problem exists.

* * * * *